(12) United States Patent
Lee et al.

(10) Patent No.: US 10,755,761 B2
(45) Date of Patent: Aug. 25, 2020

(54) SEMICONDUCTOR DEVICE AND SYSTEM

(71) Applicant: SK hynix Inc., Icheon-si Gyeonggi-do (KR)

(72) Inventors: Sang Kwon Lee, Yongin-si (KR); Kwang Soon Kim, Icheon-si (KR); Young Hoon Kim, Icheon-si (KR); Young Jun Yoon, Icheon-si (KR); Kyu Dong Hwang, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/653,744

(22) Filed: Oct. 15, 2019

(65) Prior Publication Data

US 2020/0043542 A1    Feb. 6, 2020

Related U.S. Application Data

(62) Division of application No. 15/947,382, filed on Apr. 6, 2018, now Pat. No. 10,522,206.

(30) Foreign Application Priority Data

Apr. 6, 2017  (KR) .................. 10-2017-0044802
Nov. 1, 2017  (KR) .................. 10-2017-0144612

(51) Int. Cl.
*G11C 7/00*        (2006.01)
*G11C 11/34*       (2006.01)
(Continued)

(52) U.S. Cl.
CPC ............ *G11C 11/34* (2013.01); *G11C 7/1012* (2013.01); *G11C 7/1057* (2013.01);
(Continued)

(58) Field of Classification Search
CPC ..... G11C 11/34; G11C 7/1012; G11C 7/1057; G11C 7/1084; G11C 7/1087; G11C 7/1093; G11C 7/222
(Continued)

(56) References Cited

U.S. PATENT DOCUMENTS 5,809,225 A * 9/1998 Ohsawa ................. G11C 29/08
                                                714/32
6,462,998 B1 * 10/2002 Proebsting ............... G11C 7/04
                                                257/E21.659
(Continued)

FOREIGN PATENT DOCUMENTS

KR    1020080048378 A    6/2008
KR    1020090003647 A    1/2009
KR    1020090020996 A    2/2009

*Primary Examiner* — Viet Q Nguyen
(74) *Attorney, Agent, or Firm* — William Park & Associates LTD.

(57) ABSTRACT

A semiconductor device may include a first buffer, a second buffer, a divider circuit and an internal signal generation circuit. The first buffer may buffer a first input signal and a second input signal to generate a first data strobe buffering signal and a first data strobe bar buffering signal. The second buffer may generate a second data strobe buffering signal based on the first input signal and a reference xvoltage. The divider circuit may divide the second data strobe buffering signal to generate a divided signal and a divided bar signal. The internal signal generation circuit may be configured to generate a first to fourth data latch timing signals having different phases based on the first data strobe buffering signal, the first data strobe bar buffering signal, the divided signal and the divided buffering signal.

4 Claims, 7 Drawing Sheets

(51) Int. Cl.
*G11C 7/22* (2006.01)
*G11C 7/10* (2006.01)

(52) U.S. Cl.
CPC .......... *G11C 7/1084* (2013.01); *G11C 7/1087* (2013.01); *G11C 7/1093* (2013.01); *G11C 7/222* (2013.01)

(58) Field of Classification Search
USPC ................ 365/174, 200, 189.05, 193, 194
See application file for complete search history.

(56) References Cited

U.S. PATENT DOCUMENTS

| | | | |
|---|---|---|---|
| 6,545,938 B2 | 4/2003 | Lee et al. | |
| 6,862,248 B2 | 3/2005 | Shin | |
| 7,020,031 B2 | 3/2006 | Shin et al. | |
| 7,054,221 B2 | 5/2006 | Shim | |
| 7,342,838 B1* | 3/2008 | Sharpe-Geisler | G06F 13/4243 326/39 |
| 7,626,873 B2* | 12/2009 | Ku | G11C 7/1051 365/189.05 |
| 7,791,965 B2* | 9/2010 | Lee | G11C 7/02 365/189.05 |
| 7,889,579 B2 | 2/2011 | Faue | |
| 7,948,812 B2* | 5/2011 | Ware | G06F 13/1689 365/185.05 |
| 7,969,792 B2* | 6/2011 | Park | G11C 7/1072 365/189.05 |
| 7,990,782 B2* | 8/2011 | Lee | G11C 7/02 365/148 |
| 8,009,492 B2 | 8/2011 | Song et al. | |
| 8,320,199 B2 | 11/2012 | Yoon | |
| 8,456,924 B2* | 6/2013 | Song | G11C 7/1006 365/189.05 |
| 8,867,302 B2 | 10/2014 | Kwon et al. | |
| 8,947,942 B2 | 2/2015 | Ko et al. | |
| 9,214,217 B2 | 12/2015 | Ikehata et al. | |
| 9,437,261 B2 | 9/2016 | Tokuhiro | |
| 9,478,264 B2 | 10/2016 | Song et al. | |
| 9,530,472 B1 | 12/2016 | Park et al. | |
| 9,613,666 B1 | 4/2017 | Koh et al. | |
| 9,792,969 B1 | 10/2017 | Kim et al. | |
| 9,857,973 B1 | 1/2018 | Chae et al. | |
| 10,243,584 B2* | 3/2019 | Yu | H03M 13/098 |
| 10,366,742 B1 | 7/2019 | Penney | |
| 10,388,359 B2 | 8/2019 | Kim | |
| 10,522,206 B2* | 12/2019 | Lee | G11C 7/1012 |
| 2003/0210575 A1* | 11/2003 | Seo | G11C 7/1045 365/189.05 |
| 2005/0195679 A1* | 9/2005 | Faue | G11C 7/1027 365/233.1 |
| 2007/0008784 A1* | 1/2007 | Faue | G11C 7/1072 365/189.16 |
| 2007/0063731 A1 | 3/2007 | Kuroki | |
| 2009/0190410 A1 | 7/2009 | Faue | |
| 2012/0113728 A1 | 5/2012 | Kwon et al. | |
| 2012/0182816 A1* | 7/2012 | Ide | G11C 29/56008 365/200 |
| 2013/0049864 A1 | 2/2013 | Ikehata et al. | |
| 2017/0031653 A1 | 2/2017 | Hwang et al. | |
| 2018/0090190 A1 | 3/2018 | Hong | |
| 2018/0122719 A1 | 5/2018 | Kwak et al. | |
| 2018/0350415 A1 | 12/2018 | Yoon | |
| 2019/0122719 A1 | 4/2019 | Kim | |

* cited by examiner

233

SEMICONDUCTOR DEVICE AND SYSTEM

CROSS-REFERENCES TO RELATED APPLICATION

The present application is a divisional application of U.S. patent application Ser. No. 15/947,382, filed on Apr. 6, 2018, and claims priority under 35 U.S.C. § 119(a) to Korean application number 10-2017-0044802, filed on Apr. 6, 2017, and Korean application number 10-2017-0144612, filed on Nov. 1, 2017, in the Korean Intellectual Property Office, which is incorporated herein by reference in its entirety.

BACKGROUND

1. Technical Field

Various embodiments may generally relate to a semiconductor integrated circuit, more particularly, to a semiconductor device and a system.

2. Related Art

A semiconductor device may receive external signals to perform various operations.

As the semiconductor device may require a rapid operational speed, frequencies of the signals inputted/outputted into/from the semiconductor device may be heightened.

In order to provide the semiconductor device with the rapid operational speed, the semiconductor device may divide the external signal to generate a plurality of divided signals. The semiconductor device may be operated in response to the divided signals.

However, when timings of the divided signals are dislocated or phases of the divided signal are warped, the semiconductor device may malfunction.

SUMMARY

In an embodiment of the present disclosure, a semiconductor device may be provided. The semiconductor device may include a first buffer, a second buffer, a divider circuit and an internal signal generation circuit. The first buffer may buffer a first input signal and a second input signal to generate a first data strobe buffering signal and a first data strobe bar buffering signal. The second buffer may generate a second data strobe buffering signal based on the first input signal and a reference voltage. The divider circuit may divide the second data strobe buffering signal to generate a divided signal and a divided bar signal. The internal signal generation circuit may be configured to generate a first data latch timing signal, a second data latch timing signal, a third data latch timing signal and a fourth data latch timing signal having different phases based on the first data strobe buffering signal, the first data strobe bar buffering signal, the divided signal and the divided buffering signal.

In an embodiment of the present disclosure, a semiconductor device may be provided. The semiconductor device may include a first buffer, a second buffer, a divider circuit and an internal signal generation circuit. The first buffer may buffer a data strobe signal and a data strobe bar signal to generate a first data strobe buffering signal and a first data strobe bar buffering signal. The second buffer may be configured to generate a second data strobe buffering signal based on a reference voltage and the data strobe signal. The divider circuit may divide the second data strobe buffering signal to generate a divided signal and a divided bar signal. The internal signal generation circuit may synchronize the divided signal and the divided bar signal with the first data strobe buffering signal to generate a first data latch timing signal and a second data latch timing signal, and to synchronize the first data latch timing signal and the second data latch timing signal with the first data strobe bar buffering signal to generate a third data latch timing signal and a fourth data latch timing signal.

In an embodiment of the present disclosure, a semiconductor device may be provided. The semiconductor device may include a first buffer, a second buffer and a selection circuit. The first buffer may be configured to generate and output a first buffering signal based on an input signal and an input bar signal. The second buffer may be configured to generate and output a second buffering signal based on a reference voltage and the input signal. The selection circuit may be configured to transmit any one of the first and second buffering signals to a divider circuit based on a selection signal.

In an embodiment of the present disclosure, a semiconductor device may be provided. The semiconductor device may include a set circuit, a fuse circuit, a data latch timing signal generation circuit and a data sort circuit. The set circuit may be configured to generate and output a set signal based on a command and an address. The fuse circuit may be configured to generate and output a fuse signal having a level determined in accordance with a fuse cutting. The data latch timing signal generation circuit may be configured to generate a plurality of data latch timing signals based on the set signal, the fuse signal, a data strobe signal and a data strobe bar signal or based on the data strobe signal, the data strobe bar signal and a reference voltage. The data sort circuit may latch and sort data based on the data latch timing signals to generate and output internal data.

In an embodiment of the present disclosure, a system may be provided. The system may include a controller and a semiconductor device. The controller may be configured to provide a command, an address and a clock. The controller may transmit and receive data and a data strobe signal. The semiconductor device may receive the command, the address and the clock. The semiconductor device may transmit and receive the data and the data strobe signal. The semiconductor device may include a set circuit, a fuse circuit, a first buffer, a second buffer, a control circuit, a selection circuit and a divider circuit. The set circuit may be configured to generate a set signal based on the command and the address. The fuse circuit may be configured to generate and output a fuse signal having a level determined in accordance with a fuse cutting. The first buffer may buffer the data strobe signal to generate a first buffering signal. The second buffer may be configured to determine a voltage level of the of the data strobe signal by comparing a voltage level of the data strobe signal with a voltage level of the reference voltage and buffer the determined data strobe signal to generate a second buffering signal. The control circuit may be configured to generate a selection signal based on the fuse signal and the set signal. The selection circuit may be configured to output any one of the first and second buffering signals based on the selection signal. The divider circuit may be configured to divide an output signal from the selection circuit.

DETAILED DESCRIPTION

Various embodiments will be described below with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments. However, embodiments should not be construed as limiting. Although a few embodiments will be illustrated and described, it will be appreciated by those of ordinary skill in the art that changes may be made in these embodiments without departing from the principles and spirit of the present disclosure.

Examples of embodiments may provide a semiconductor device capable of performing accurate transmitting/receiving operations and generating normal divided signals.

Examples of embodiments may also provide a system including the above-mentioned semiconductor device.

According to some embodiments, the semiconductor device and the system may be capable of accurately transmitting and receiving the data between the semiconductor device and the controller. Further, the semiconductor device may generate the normal divided signals to perform internal operations so that the semiconductor device may have improved operational reliability.

In an example of an embodiment, a semiconductor device may receive a data strobe signal DQS among signals inputted from an external device. However, the input signal might not be restricted within the data strobe signal DQS.

Figure 1:
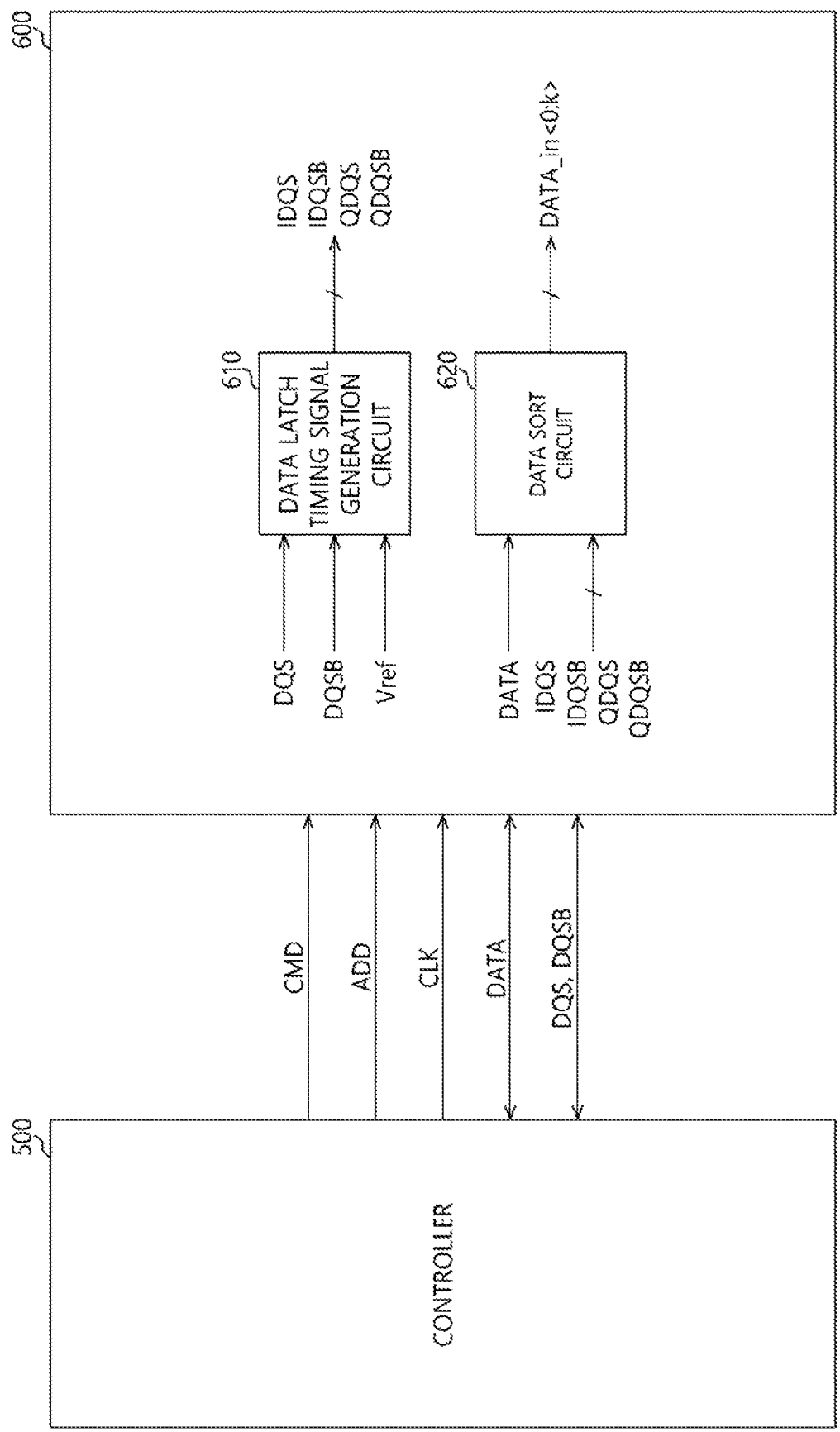
FIG. 1 is a block diagram illustrating a system including a semiconductor device in accordance with an example of an embodiment.

FIG. 1 is a block diagram illustrating a system including a semiconductor device in accordance with an example of an embodiment.

Referring to FIG. 1, a system may include a controller 500 and a semiconductor device 600.

The controller 500 may be electrically connected with the semiconductor device 600. Signals may be transmitted between the controller 500 and the semiconductor device 600.

For example, the controller 500 may provide the semiconductor device 600 with a command CMD, an address ADD, a clock CLK, data DATA and a data strobe signal DQS. The semiconductor device 600 may receive the command CMD, the address ADD, the clock CLK, the data DATA and the data strobe signal DQS. The semiconductor device 600 may provide the controller 500 with the data DATA and the data strobe signal DQS. The data strobe signal DQS may include a data strobe bar signal DQSB having a level opposite to a level of the data strobe signal DQS.

Particularly, the semiconductor device 600 may be synchronized with the clock CLK. The semiconductor device 600 may store the data DATA in response to the command CMD and the address ADD. The semiconductor device 600 may output the stored data DATA. The semiconductor device 600 may receive and output the data DATA in response to the data strobe signal DQS.

The semiconductor device 600 may include a data latch timing signal generation circuit 610 and a data sort circuit 620.

The data latch timing signal generation circuit 610 may be configured to generate first to fourth data latch timing signals IDQS, IDQSB, QDQS and QDQSB in response to the data strobe signal DQS, the data strobe bar signal DQSB and a reference voltage Vref.

The data sort circuit 620 may be configured to generate and output internal data DATA_in<0:k> in response to the data DATA and the first to fourth data latch timing signals IDQS, IDQSB, QDQS and QDQSB. For example, the data sort circuit 620 may latch the data DATA in response to the first to fourth data latch timing signals IDQS, IDQSB, QDQS and QDQSB. The data sort circuit 620 may sort the latched data. The data sort circuit 620 may output the sorted data as the internal data DATA_in<0:k>.

Figure 2:
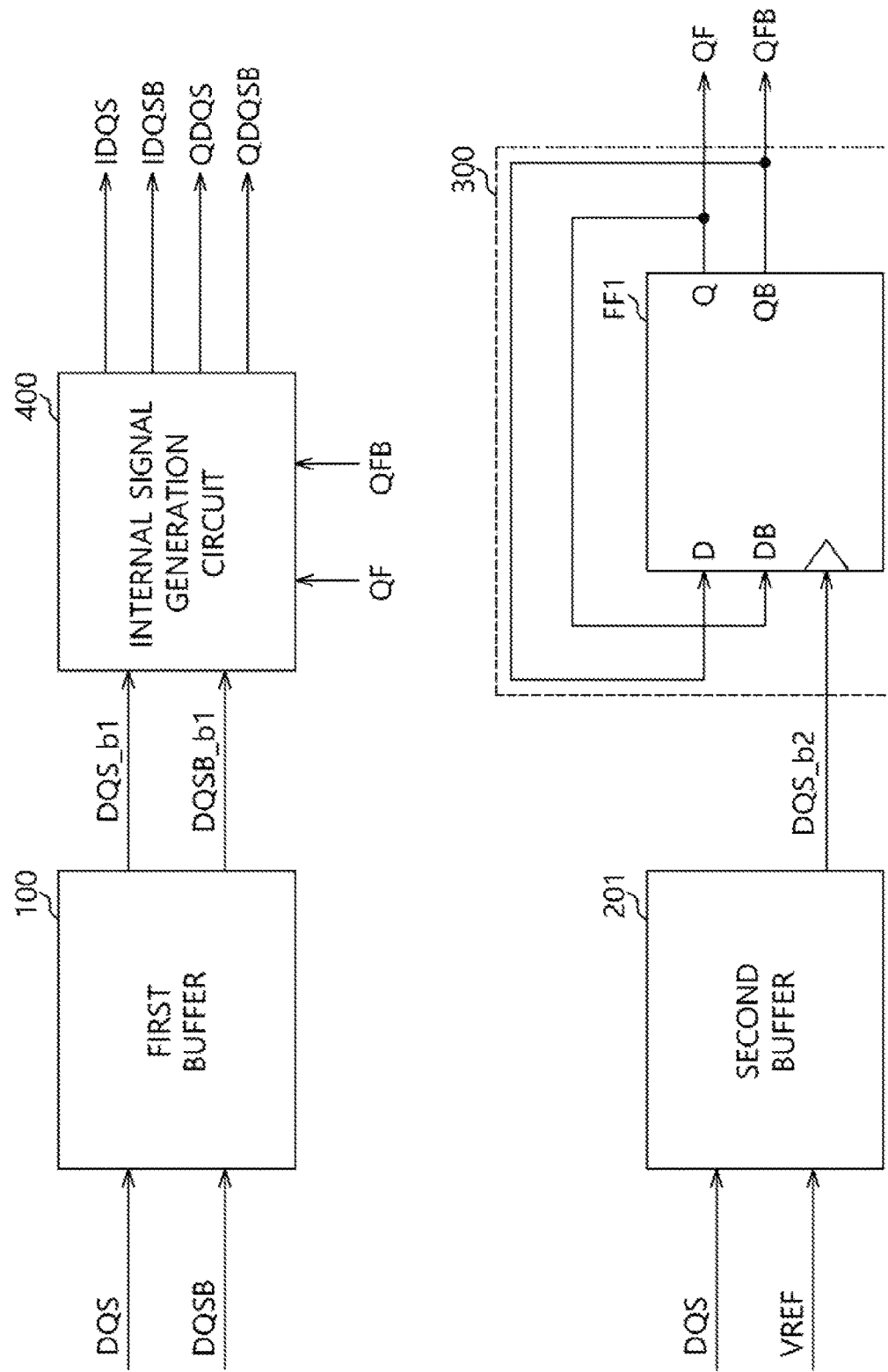
FIG. 2 is a block diagram illustrating a data latch timing signal generation circuit in accordance with an example of an embodiment.

FIG. 2 is a block diagram illustrating a data latch timing signal generation circuit in accordance with an example of an embodiment.

Referring to FIG. 2, the data latch timing signal generation circuit 610 may include a first buffer 100, a second buffer 201, a divider circuit 300 and an internal signal generation circuit 400.

The first buffer 100 may buffer the data strobe signal DQS and the data strobe bar signal DQSB to generate a first data strobe buffering signal DQS_b1 and a first data strobe bar buffering signal DQSB_b1. For example, the first buffer 100 may generate the first data strobe buffering signal DQS_b1 and the first data strobe bar buffering signal DQSB_b1 in response to a voltage difference between the data strobe signal DQS and the data strobe bar signal DQSB. The data strobe signal DQS and the data strobe bar signal DQSB may include differential signals having opposite phases. Further, the first data strobe buffering signal DQS_b1 and the first data strobe bar buffering signal DQSB_b1 may also include differential signals having opposite phases.

The second buffer 201 may generate a second data strobe buffering signal DQS_b2 in response to the data strobe signal DQS and the reference voltage Vref. In an embodiment, the second buffer 201 may determine a voltage level of the data strobe signal DQS by comparing a voltage level of the data strobe signal DQS with a voltage level of the reference voltage Vref to generate the second data strobe buffering signal DQS_b2. Particularly, the second buffer 201 may determine a voltage level of the data strobe signal DQS by comparing a voltage level of the data strobe signal DQS with a voltage level of the reference voltage Vref to determine a voltage level of the data strobe signal DQS and then buffer the determined data strobe signal to generate the second data strobe buffering signal DQS_b2. In other embodiments, the second buffer 201 may determine a voltage level of the data strobe signal DQS by comparing a voltage level of the data strobe signal DQS with a voltage level of the reference voltage Vref to generate the second data strobe buffering signal dQS_b2 and then output the second data strobe buffering signal dQS_b2 to the divider circuit 300. In some embodiments, the second buffer 201 may generate a second data strobe buffering signal DQS_b2 based on a voltage difference between a reference voltage VREF and a voltage of a data strobe signal DQS. In some embodiments, the second buffer 201 may perform a buffering operation to generate a second data strobe buffering signal DQS_b2 and determine a voltage difference between a reference voltage VREF and a voltage of a data strobe signal DQS to generate the second data strobe buffering signal DQS_b2.

The divider circuit 300 may divide the second data strobe buffering signal DQS_b2 to generate a divided signal QF and a divided bar signal QFB. The divided signal QF and the divided bar signal QFB may include differential signals having opposite phases.

The divider circuit 300 may include a first flip-flop FF1. The first flip-flop FF1 may have a clock input terminal configured to receive the second data strobe buffering signal DQS_b2, a second input terminal DB configured to receive the divided signal QF outputted from a first output terminal Q, and a first input terminal D configured to receive the divided bar signal QFB outputted from the second output terminal QB. The divided signal QF outputted from the first output terminal Q and the divided bar signal QFB outputted from the second output terminal QB may be inputted into the internal signal generation circuit 400.

The internal signal generation circuit 400 may generate the first to fourth data latch timing signals IDQS, IDQSB, QDQS and QDQSB in response to the first data strobe buffering signal DQS_b1, the first data strobe bar buffering signal DQSB_b1, the divided signal QF and the divided bar signal QFB. For example, the internal signal generation circuit 400 may synchronize the divided signal QF and the divided bar signal QFB with the first data strobe buffering signal DQS_b1 to generate the first and second data latch timing signals IDQS and IDQSB. The internal signal generation circuit 400 may synchronize the first and second data latch timing signals IDQS and IDQSB with the first data strobe bar signal DQSB_b1 to generate the third and fourth data latch timing signals QDQS and QDQSB. The first data latch timing signal IDQS may have a phase opposite to that of the second data latch timing signal IDQSB. The third data latch timing signal QDQS may have a phase opposite to that of the fourth data latch timing signal QDQSB. The phase of the first data latch timing signal IDQS may be different from the phase of the third latch timing signal QDQS by about 90°.

Figure 3:
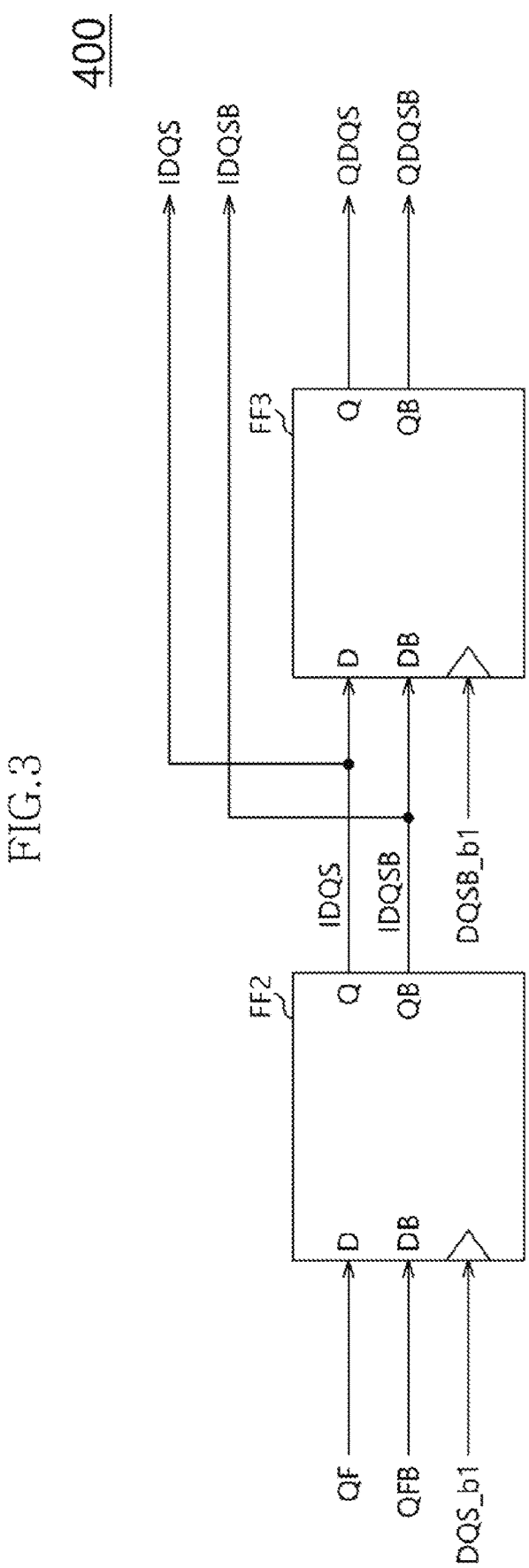
FIG. 3 is a block diagram illustrating an internal signal generation circuit in FIG. 2.

FIG. 3 is a block diagram illustrating an internal signal generation circuit in FIG. 2.

Referring to FIG. 3, the internal signal generation circuit 400 may include a second flip-flop FF2 and a third flip-flop FF3.

The second flip-flop FF2 may synchronize the divided signal QF and the divided bar signal QFB with the first data strobe buffering signal DQS_b1 to generate the first data latch timing signal IDQS and the second data latch timing signal IDQSB. For example, the second flip-flop FF2 may latch the divided signal QF when the first data strobe buffering signal DQS_b1 rises. The second flip-flop FF2 may output a latched signal as the first data latch timing signal IDQS. The second flip-flop FF2 may latch the divided bar signal QFB when the first data strobe buffering signal DQS_b1 rises. The second flip-flop FF2 may output a latched signal as the second data latch timing signal IDQSB.

The second flip-flop FF2 may sample the divided signal QF and the divided bar signal QFB when the first data strobe buffering signal DQS_b1 rises. The second flip-flop FF2 may output a sampled signal as the first and second data latch timing signals IDQS and IDQSB.

The second flip-flop FF2 may have a first input terminal D configured to receive the divided signal QF, a second input terminal DB configured to receive the divided bar signal QFB, a clock input terminal configured to receive the first data strobe buffering signal DQS_b1, a first output terminal Q configured to output the first data latch timing signal IDQS, and a second output terminal QB configured to output the second data latch timing signal IDQSB.

The third flip-flop FF3 may synchronize the first data latch timing signal IDQS and the second data latch timing signal IDQSB with the first data strobe bar buffering signal DQSB_b1 to generate the third data latch timing signal QDQS and the fourth data latch timing signal QDQSB. For example, the third flip-flop FF3 may latch the first data latch timing signal IDQS when the first data strobe bar buffering signal DQSB_b1 rises. The third flip-flop FF3 may output a latched signal as the third data latch timing signal QDQS. The third flip-flop FF3 may latch the second data latch timing signal IDQSB when the first data strobe bar buffering signal DQSB_b1 rises. The third flip-flop FF3 may output a latched signal as the fourth data latch timing signal QDQSB. The third flip-flop FF3 may sample the first and second data latch timing signals IDQS and IDQSB when the first data strobe bar buffering signal DQSB_b1 rises. The third flip-flop FF3 may output a sampled signal as the third and fourth data latch timing signals QDQS and QDQSB.

The third flip-flop FF3 may have a first input terminal D configured to receive the first data latch timing signal IDQS, a second input terminal DB configured to receive the second data latch timing signal IDQSB, a clock input terminal configured to receive the first data strobe bar buffering signal DQSB_b1, a first output terminal Q configured to output the third data latch timing signal QDQS, and a second output terminal QB configured to output the fourth data latch timing signal QDQSB.

Hereinafter, operations of the semiconductor device may be illustrated below.

The first buffer 100 may receive the data strobe signal DQS and the data strobe bar signal DQSB. The first buffer 100 may buffer the data strobe signal DQS and the data strobe bar signal DQSB to generate the first data strobe buffering signal DQS_b1 and the first data strobe bar buffering signal DQSB_b1. The first buffer 100 may generate the first data strobe buffering signal DQS_b1 and the first data strobe bar buffering signal DQSB_b1 in response to the voltage level difference between the data strobe signal DQS and the data strobe bar signal DQSB. The first data strobe buffering signal DQS_b1 and the first data strobe bar buffering signal DQSB_b1 may include the differential signals having the opposite phases.

The second buffer 201 may buffer the data strobe signal DQS based on the voltage level of the reference voltage Vref to generate the second data strobe buffering signal DQS_b2.

The divider circuit 300 may divide the second data strobe buffering signal DQS_b2 to generate the divided signal QF and the divided bar signal QFB. The divided signal QF and the divided bar signal QFB may include the differential signals having the opposite phases.

The internal signal generation circuit 400 may synchronize the divided signal QF and the divided bar signal QFB with the first data strobe buffering signal DQS_b1 to generate the first and second data latch timing signals IDQS and IDQSB. The internal signal generation circuit 400 may synchronize the first and second data latch timing signals IDQS and IDQSB with the first data strobe bar buffering signal DQSB_b1 to generate the third and fourth data latch timing signals QDQS and QDQSB.

Figure 4:
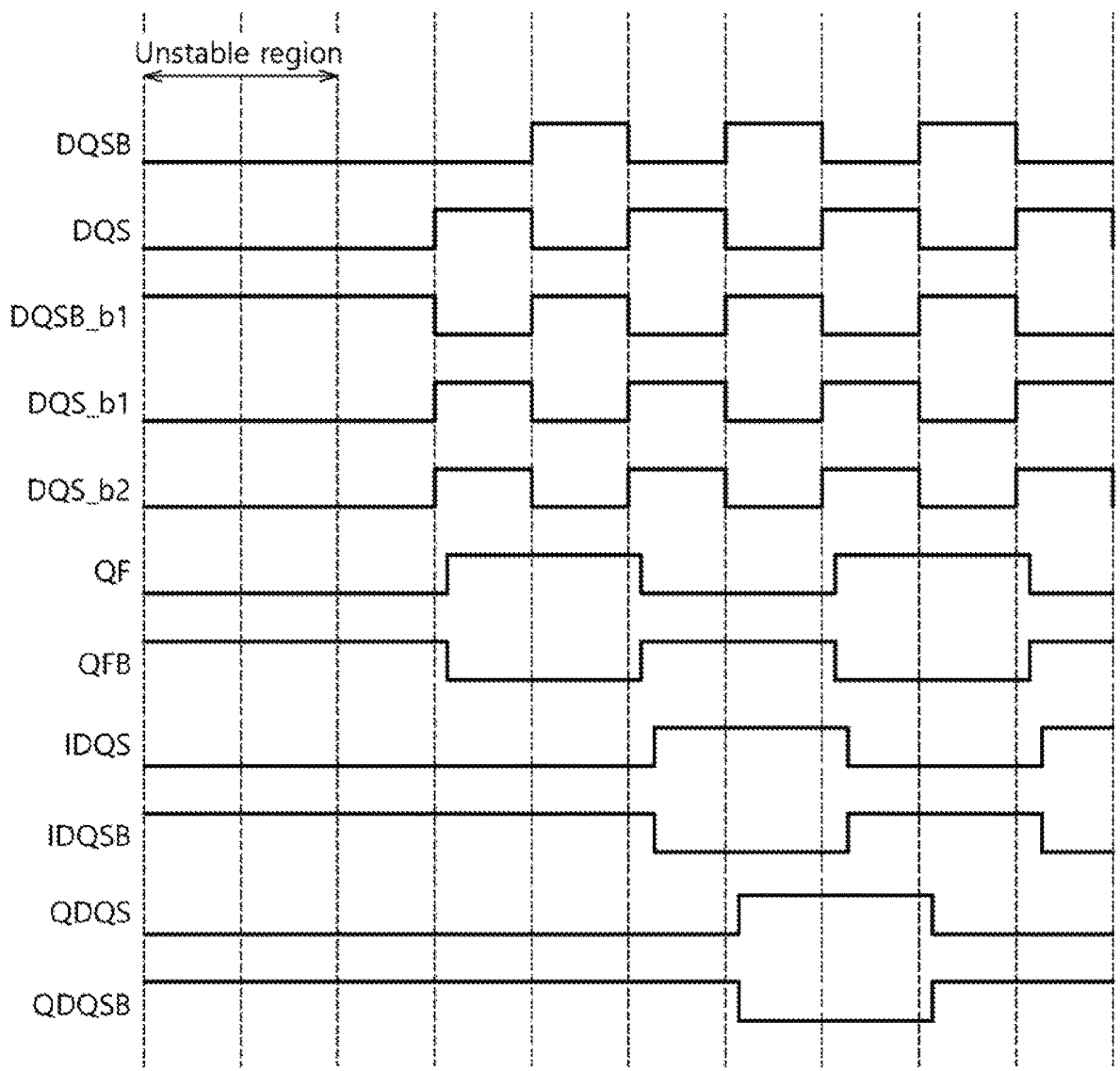
FIG. 4 is a timing chart illustrating a semiconductor device in accordance with an example of an embodiment.

Hereinafter, operations of the internal signal generation circuit 400 may be illustrated with reference to FIGS. 3 and 4. The internal signal generation circuit 400 may include the second and third flip-flops FF2 and FF3.

The second flip-flop FF2 may output the level of the divided signal QF at the rising timing of the first data strobe buffering signal DQS_b1 as the first data latch timing signal IDQS. The second flip-flop FF2 may output the level of the divided bar signal QFB at the rising timing of the first data strobe buffering signal DQS_b1 as the second data latch timing signal IDQSB.

The third flip-flop FF3 may output the level of the first data latch timing signal IDQS at the rising timing of the first data strobe bar buffering signal DQSB_b1 as the third data latch timing signal QDQS. The third flip-flop FF3 may output the level of the second data latch timing signal IDQSB at the rising timing of the first data strobe bar buffering signal DQSB_b1 as the fourth data latch timing signal QDQSB.

In an example of an embodiment, the semiconductor device may divide the data strobe signal DQS to generate the first to fourth data latch timing signals IDQS, IDQSB, QDQS and QDQSB.

In an example of an embodiment, the semiconductor device might not divide the output of the buffer configured to buffer the differential signals DQS and DQSB, for example, the first buffer 100. The semiconductor device may divide the output of the buffer, for example, the second buffer 201 having the reference voltage Vref and the input signal DQS as the input signals may compare the voltage level of the reference voltage Vref to the input signal DQS to determine the voltage level of the input signal DQS to suppress a glitch or a noise from being generated in the input signal, thereby preventing the phases of the divided clocks from being changed. Particularly, the glitch or the noise in the input signals may be frequently generated in an unstable region (i.e., see FIG. 4) where the level of the input signal might not be specified, i.e., a region where the input signal might not be toggled.

Figure 5:
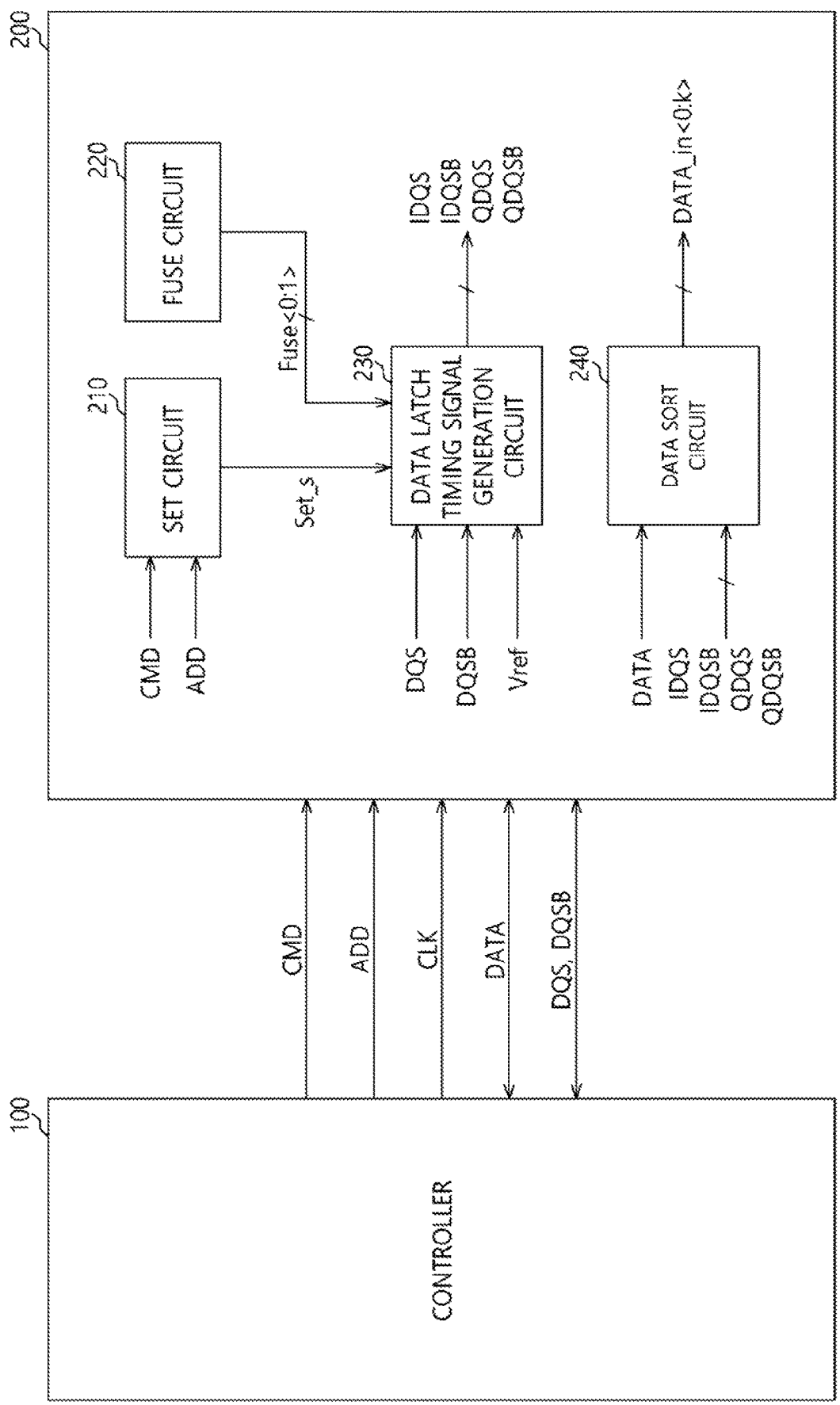
FIG. 5 is a block diagram illustrating a system including a semiconductor device in accordance with an example of an embodiment.

FIG. 5 is a block diagram illustrating a system including a semiconductor device in accordance with an example of an embodiment.

Referring to FIG. 5, a system may include a controller 100 and a semiconductor device 200.

The controller 100 may be electrically connected with the semiconductor device 200. Signals may be transmitted between the controller 100 and the semiconductor device 200.

For example, the controller 100 may provide the semiconductor device 200 with a command CMD, an address ADD, a clock CLK, data DATA and a data strobe signal DQS. The semiconductor device 200 may receive the command CMD, the address ADD, the clock CLK, the data DATA and the data strobe signal DQS. The semiconductor device 200 may provide the controller 100 with the data DATA and the data strobe signal DQS. The data strobe signal DQS may include a data strobe bar signal DQSB having a level opposite to a level of the data strobe signal DQS.

Particularly, the semiconductor device 200 may be synchronized with the clock CLK. The semiconductor device 200 may store the data DATA in response to the command CMD and the address ADD. The semiconductor device 200 may output the stored data DATA. The semiconductor device 200 may receive and output the data DATA in response to the data strobe signal DQS.

The semiconductor device 200 may include a set circuit 210, a fuse circuit 220, a data latch timing signal generation circuit 230 and a data sort circuit 240.

The set circuit 210 may be configured to store and output option information of the semiconductor device 200 in accordance with set environments of the semiconductor device 200. The set circuit 210 may include a mode register set circuit. The set circuit 210 may determine levels of set signals Set_s in response to the command CMD and the address ADD. The set circuit 210 may output the set signals Set_s having the determined levels. In an example of an embodiment, FIG. 5 may depict one set signal Set_s. Alternatively, the set signal Set_s may include at least two signals.

The fuse circuit 220 may be configured to determine levels of fuse signals in accordance with cuttings of fuses. The fuse circuit 220 may be configured to output the fuse signals having the determined levels. The fuse circuit 220 may output a plurality of the fuse signals. In an example of an embodiment, the two fuse signals Fuse<0:1> may be depicted and illustrated.

For example, the fuse circuit 220 may determine levels of a first fuse signal Fuse<0> and a second fuse signal Fuse<1> in accordance with the cuttings of the fuses. The fuse circuit 220 may output the first and second fuse signals Fuse<0:1> having the determined levels.

The set signal Set_s outputted from the set circuit 210 and the first and second fuse signals Fuse<0:1> may function to set options in accordance with operational modes of the semiconductor device 200. The set circuit 210 may change the level of the set signal Set_s using the command CMD and the address ADD. Thus, the controller 100 may change the level of the set signal Set_s. In contrast, the fuse circuit 200 may determine the levels of the first and second fuse signals Fuse<0:1> in accordance with the cuttings of the fuses. Thus, the determined levels of the fuse signals Fuse<0:1> might not be changed.

The data latch timing signal generation circuit 230 may be configured to generate first to fourth data latch timing signals IDQS, IDQSB, QDQS and QDQSB in response to the set signal Set_s, the first and second fuse signals Fuse<0:1>, the data strobe signal DQS, the data strobe bar signal DQSB and the reference voltage Vref.

For example, the data latch timing signal generation circuit 230 may select the data strobe signal DQS and the data strobe bar signal DQSB in response to the set signal Set_s and the first and second fuse signals Fuse<0:1>. The data latch timing signal generation circuit 230 may generate the first to fourth data latch timing signals IDQS, IDQSB, QDQS and QDQSB in response to the data strobe signal DQS and the data strobe bar signal DQSB. The data latch timing signal generation circuit 230 may generate the first to fourth data latch timing signals IDQS, IDQSB, QDQS and QDQSB in response to the set signal Set_s and the first and second fuse signals Fuse<0:1> in accordance with the data strobe signal DQS, the data strobe bar signal DQSB and the reference voltage Vref.

The data sort circuit 240 may be configured to generate and output internal data DATA_in<0:k> in response to the data DATA and the first to fourth data latch timing signals IDQS, IDQSB, QDQS and QDQSB. For example, the data sort circuit 240 may latch the data DATA in response to the first to fourth data latch timing signals IDQS, IDQSB, QDQS and QDQSB. The data sort circuit 240 may sort the latched data. The data sort circuit 240 may output the sorted data as the internal data DATA_in<0:k>.

Figure 6:
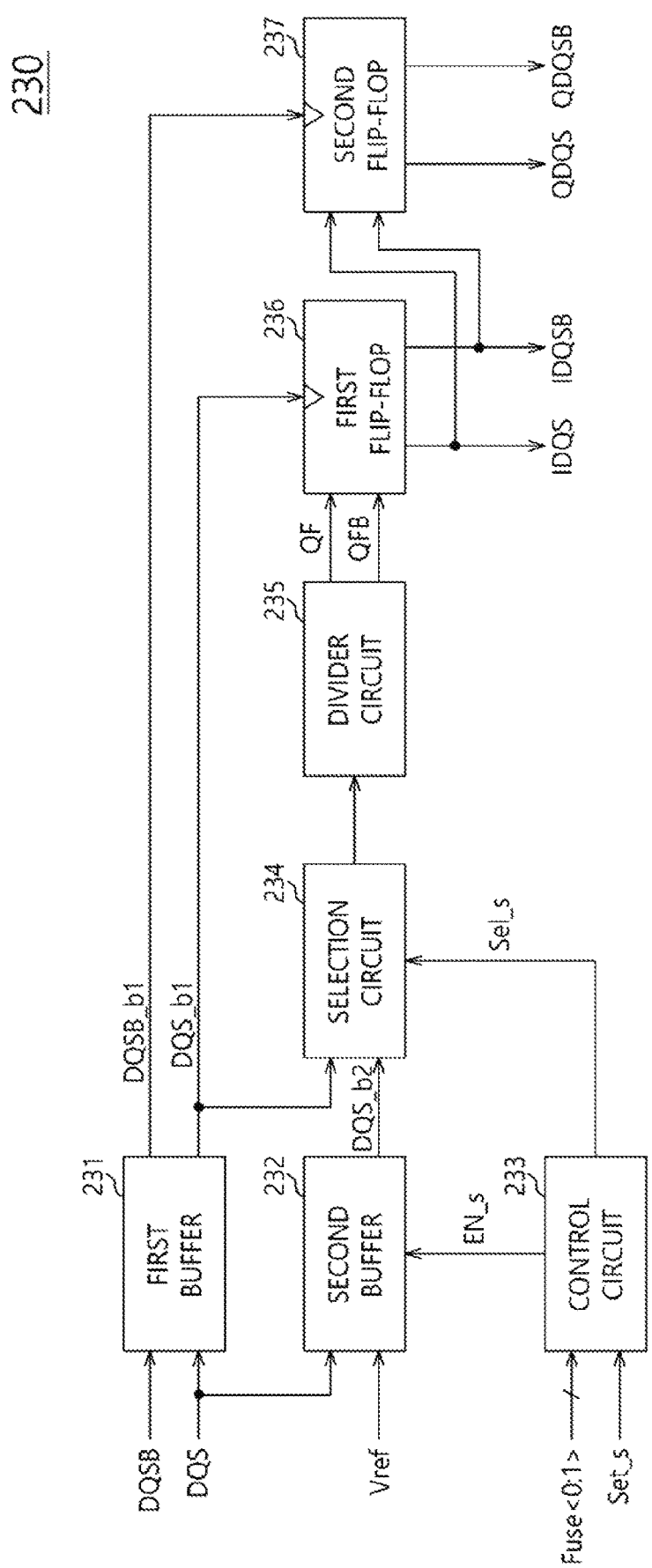
FIG. 6 is a block diagram illustrating a data latch timing signal generation circuit in accordance with an example of an embodiment.

FIG. 6 is a block diagram illustrating a data latch timing signal generation circuit in accordance with an example of an embodiment.

Referring to FIG. 6, the data latch timing signal generation circuit 230 may include a first buffer 231, a second buffer 232, a control circuit 233, a selection circuit 234, a divider circuit 235, first synchronizing circuit 236 and a second synchronizing circuit 237.

The first buffer 231 may be configured to generate a first data strobe buffering signal DQS_b1 and a first data strobe bar buffering signal DQSB_b1 in response to the data strobe signal DQS and the data strobe bar signal DQSB. For example, the first buffer 231 may buffer the data strobe signal DQS and the data strobe bar signal DQSB to output the first data strobe buffering signal DQS_b1 and the first data strobe bar buffering signal DQSB_b1. The first buffer 231 may generate and output the first data strobe buffering signal DQS_b1 and the first data strobe bar buffering signal DQSB_b1 in response to a voltage difference between the data strobe signal DQS and the data strobe bar signal DQSB. The data strobe signal DQS and the data strobe bar signal DQSB may include differential signals having opposite phases. Further, the first data strobe buffering signal DQS_b1 and the first data strobe bar buffering signal DQSB_b1 may also include differential signals having opposite phases.

The second buffer 232 may generate and output a second data strobe buffering signal DQS_b2 in response to the data strobe signal DQS and the reference voltage Vref. The second buffer 232 may be activated in response to an enabling signal EN_s. The activated second buffer 232 may generate and output the second data strobe buffering signal DQS_b2. For example, the activated second buffer 232 may buffer the data strobe signal DQS based on a voltage level of the reference voltage Vref. The activated second buffer 232 may output the buffered signal as the second data strobe buffering signal DQS_b2. Particularly, the activated second buffer 232 may determine a voltage level of the data strobe signal DQS based on the voltage level of the reference voltage Vref. The activated second buffer 232 may generate and output the second data strobe buffering signal DQS_b2 based on determined results. In an embodiment, when the second buffer 232 is activated, the second buffer 232 may determine a voltage level of the data strobe signal DQS by comparing a voltage level of the data strobe signal DQS with a voltage level of the reference voltage Vref to generate the second data strobe buffering signal DQS_b2. Particularly, the second buffer 232 may determine a voltage level of the data strobe signal DQS by comparing a voltage level of the data strobe signal DQS with a voltage level of the reference voltage Vref to determine a voltage level of the data strobe signal DQS and then buffer the determined data strobe signal to generate the second data strobe buffering signal DQS_b2. In other embodiments, the second buffer 232 may determine a voltage level of the data strobe signal DQS by comparing a voltage level of the data strobe signal DQS with a voltage level of the reference voltage Vref to generate the second data strobe buffering signal dQS_b2 and then output the second data strobe buffering signal dQS_b2 to the selection circuit 234. In some embodiments, the second buffer 232 may perform a buffering operation to generate a second data strobe buffering signal DQS_b2 and determine a voltage difference between a reference voltage Vref and a voltage of a data strobe signal DQS to generate the second data strobe buffering signal DQS_b2. In some embodiments, the second buffer 201 may generate a second data strobe buffering signal DQS_b2 based on a voltage difference between a reference voltage VREF and a voltage of a data strobe signal DQS The control circuit 233 may generate and output the enabling signal EN_s and a selection signal Sel_s in response to the set signal Set_s and the first and second fuse signals Fuse<0:1>. For example, the control circuit 233 may generate and output the enabling signal EN_s and the selection signal Sel_s in response to the fuse signals Fuse<0:1> regardless of the set signal Set_s. Further, the control circuit 233 may generate and output the enabling signal EN_s and the selection signal Sel_s in response to the set signal Set_s and the first and second fuse signals Fuse<0:1>.

The selection circuit 234 may output any one of the first data strobe buffering signal DQS_b1 and the second data strobe buffering signal DQS_b2 in response to the selection signal Sel_s. For example, when the selection signal may be disabled to a low level, the selection circuit 234 may output the first data strobe buffering signal DQS_b1. In contrast, when the selection signal may be enabled to a high level, the selection circuit 234 may output the second data strobe buffering signal DQS_b2. The selection circuit 234 may include a multiplexer, a switch, etc. Further, the logic levels of the signals may be different from or the opposite of those described. For example, a signal described as having a enabled "high" level may alternatively have an enabled "low" level, and a signal described as having a enabled "low" level may alternatively have a enabled "high" level. For example, a signal described as having a disabled "high" level may alternatively have an disabled "low" level, and a signal described as having a disabled "low" level may alternatively have a disabled "high" level.

The divider circuit 235 may divide an output signal from the selection circuit 234 to generate and output a divided signal QF and a divided bar signal QFB. The divided signal QF and the divided bar signal QFB may include differential signals having opposite phases.

The first synchronizing circuit 236 may synchronize output signals from the divider circuit 235 with the first data strobe buffering signal DQS_b1 to output the first and second data latch timing signals IDQS and IDQSB. For example, the first synchronizing circuit 236 may synchronize the divided signal QF with the first data strobe buffering signal DQS_b1 to output the first data latch timing signal IDQS. The first synchronizing circuit 236 may synchronize the divided bar signal QFB with the first data strobe buffering signal DQS_b1 to output the second data latch timing signal IDQSB. The first and second data latch timing signals IDQS and IDQSB may include differential signals having opposite phases. The first synchronizing circuit 236 may include a flip-flop.

The second synchronizing circuit 237 may synchronize output signals from the first synchronizing circuit 236 with the first data strobe bar buffering signal DQSB_b1 to output the third and fourth data latch timing signals QDQS and QDQSB. For example, the second synchronizing circuit 237 may synchronize the first data latch timing signal IDQS with the first data strobe buffering signal DQS_b1 to output the third data latch timing signal QDQS. The second synchronizing circuit 237 may synchronize the second data latch timing signal IDQSB with the first data strobe buffering signal DQS_b1 to output the fourth data latch timing signal QDQSB. The third and fourth data latch timing signals QDQS and QDQSB may include differential signals having opposite phases.

When the first fuse signal Fuse<O> has a low level, the control circuit 233 may enable the selection signal Sel_s and the enabling signal EN_s to a high level regardless of other signals. When the first signal Fuse<O> has a high level and the second fuse signal Fuse<1> has a low level, the control circuit 233 may disable the selection signal Sel_s and the enabling signal EN_s to a low level regardless of the set signal Set_s. When the first and second signals Fuse<0:1> has a high level, the control circuit 233 may determine and output levels of the selection signal Sel_s and the enabling signal EN_s in accordance with the set signal Set_s. When the first and second signals Fuse<0:1> have a high level and the set signal Set_s has a low level, the control circuit 233 may enable the selection signal Sel_s and the enabling signal EN_s to a high level. When the first and second signals Fuse<0:1> have a high level and the set signal Set_s has a high level, the control circuit 233 may disable the selection signal Sel_s and the enabling signal EN_s to a low level.

Figure 7:
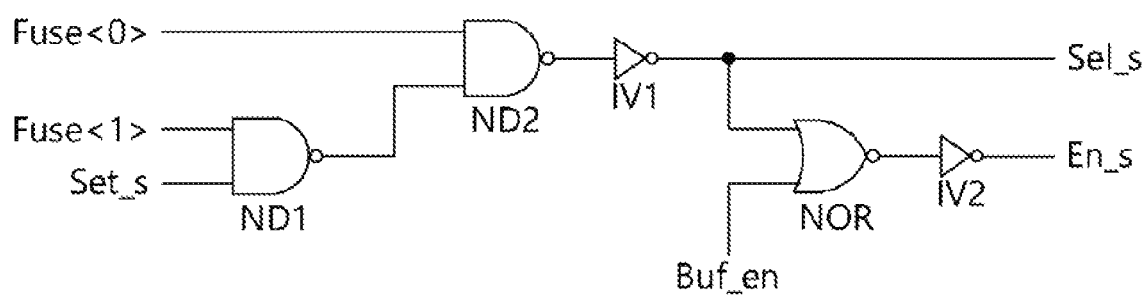
FIG. 7 is a block diagram illustrating a control circuit in FIG. 6.

FIG. 7 is a block diagram illustrating a control circuit in FIG. 6.

Referring to FIG. 7, the control circuit 233 may include logic gates. In an embodiment, the control circuit 233 may include a first NAND gate ND1, a second NAND gate ND2 and a first inverter IV1. The first NAND gate ND1 may receive the second fuse signal Fuse<1> and the set signal Set_s. The second NAND gate ND2 may receive the first fuse signal Fuse<O> and an output signal from the first NAND gate ND1. The first inverter IV1 may receive an output signal from the second NAND gate ND2 to output the selection signal Sel_s. The selection signal Sel_s may be outputted as the enabling signal EN_s.

In an embodiment, the control circuit 233 may further include a second inverter IV2 and a NOR gate NOR. The NOR gate may receive an output signal from the first inverter IV1 and a buffer enabling signal Buf_en. The second inverter IV2 may receive an output signal from the NOR gate to output the enabling signal EN_s. When the buffer enabling signal Buf_en or the selection signal Sel_s are enabled to a high level under a condition that the control circuit 233 may further include the NOR gate NOR and the second inverter IV2, the enabling signal EN_s may be enabled to a high level. The enabling signal EN_s enabled to the high level may then be outputted.

| Fuse<0> | Fuse<1> | Set_s | Sel_s |
|---------|---------|-------|-------|
| L | X | X | L |
| H | L | X | H |
| H | H | L | H |
| H | H | H | L |

The above table may be a truth table of the control circuit 233 in accordance with an example of an embodiment.

Hereinafter, operations of the semiconductor device and the system may be illustrated below.

The level of the set signal Set_s may be determined in the set circuit 210 in response to the command CMD and the address ADD. The set circuit 210 may output the set signal Set_s having the determined level.

The levels of the first and second fuse signals Fuse<0:1> may be determined in accordance with the cutting of the fuses. The first and second fuse signals Fuse<0:1> having the determined levels may then be outputted.

The data latch timing signal generation circuit 230 may generate and output the first to fourth data latch timing signals IDQS, IDQSB, QDQS and QDQSB in response to the set signal Set_s, the first and second fuse signals Fuse<0:1>, the data strobe signal DQS and the data strobe bar signal DQSB or in response to the data strobe signal DQS, the data strobe bar signal DQSB and the reference voltage Vref.

The data sort circuit 240 may latch and sort the data DATA in response to the first to fourth data latch timing signals IDQS, IDQSB, QDQS and QDQSB. The data sort circuit 240 may output the internal data DATA_in<0:k>.

Hereinafter, operations of the data latch timing signal generation circuit 230 may be illustrated with reference to FIG. 6.

The control circuit 233 may generate the selection signal Sel_s and the enabling signal EN_s in response to the first and second fuse signals Fuse<0:1> and the set signal Set_s.

When the first fuse signal Fuse<0> has a low level, the control circuit 233 may disable the selection signal Sel_s and the enabling signal EN_s to a low level regardless of other signals.

When the enabling signal EN_s is disabled to a low level, the second buffer 232 may be inactivated.

The first buffer 231 may buffer the data strobe signal DQS and the data strobe bar signal DQSB to generate and output the first data strobe buffering signal DQS_b1 and the first data strobe bar signal DQSB_b1.

When the selection signal Sel_s is disabled to a low level, the selection circuit 234 may output the first data strobe buffering signal D QS_b1 among the first data strobe buffering signal DQS_b1 and the output signal from the second buffer 232, i.e., the second data strobe buffering signal DQS_b2.

The divider circuit 235 may divide the output signal from the selection circuit 234, i.e., the first data strobe buffering signal DQS_b1 to generate and output the divided signal QF and the divided bar signal QFB.

The first synchronizing circuit 236 may synchronize the divided signal QF and the divided bar signal QFB with the first data strobe buffering signal DQS_b1 to output the first and second data latch timing signals IDQS and IDQSB.

The second synchronizing circuit 236 may synchronize the first and second data latch timing signals IDQS and IDQSB with the first data strobe buffering signal DQS_b1 to output the third and fourth data latch timing signals QDQS and QDQSB.

Therefore, when the first fuse signal Fuse<0> has a low level, the data latch timing signal generation circuit 230 may divide the output signal from the first buffer 231 into which the data strobe signal DQS and the data strobe bar signal DQSB may be inputted to generate the first to fourth data latch timing signals IDQS, IDQSB, QDQS and QDQSB.

When the first fuse signal Fuse<0> has a high level and the second fuse signal Fuse<1> may have a low level, the control circuit 233 may enable the selection signal Sel_s and the enabling signal EN_s to a high level regardless of the set signal Set_s.

When the enabling signal EN_s is enabled to a high level, the second buffer 232 may be activated.

The first buffer 231 may buffer the data strobe signal DQS and the data strobe bar signal DQSB to generate and output the first data strobe buffering signal DQS_b1 and the first data strobe bar signal DQSB_b1.

The activated second buffer 232 may buffer the data strobe signal DQS and determine the voltage level of the data strobe signal DQS by comparing the voltage level of the reference voltage Vref to the voltage level of the data strobe signal DQS to generate and output the second data strobe buffering signal DQS_b2.

When the selection signal Sel_s is enabled to a high level, the selection circuit 234 may output the second data strobe buffering signal DQS_b2 among the first data strobe buffering signal DQS_b1 and the output signal from the second buffer 232, i.e., the second data strobe buffering signal DQS_b2.

The divider circuit 235 may divide the output signal from the selection circuit 234, i.e., the second data strobe buffering signal DQS_b2 to generate and output the divided signal QF and the divided bar signal QFB.

The first synchronizing circuit 236 may synchronize the divided signal QF and the divided bar signal QFB with the first data strobe buffering signal DQS_b1 to output the first and second data latch timing signals IDQS and IDQSB.

The second synchronizing circuit 236 may synchronize the first and second data latch timing signals IDQS and IDQSB with the first data strobe buffering signal DQS_b1 to output the third and fourth data latch timing signals QDQS and QDQSB.

Therefore, when the first fuse signal Fuse<0> has a high level and the second fuse signal Fuse<1> has a low level, the data latch timing signal generation circuit 230 may divide the output signal from the second buffer 232 into which the data strobe signal DQS and the reference voltage Vref may be inputted to generate the first to fourth data latch timing signals IDQS, IDQSB, QDQS and QDQSB.

When the first and second fuse signals Fuse<0:1> has a high level and the set signal Set_s has a low level, the control circuit 233 may enable the selection signal Sel_s and the enabling signal EN_s to a high level.

When the enabling signal EN_s is enabled to a high level, the second buffer 232 may be activated.

The first buffer 231 may buffer the data strobe signal DQS and the data strobe bar signal DQSB to generate and output the first data strobe buffering signal DQS_b1 and the first data strobe bar signal DQSB_b1.

The activated second buffer 232 may buffer the data strobe signal DQS based on the voltage level of the reference voltage Vref to generate and output the second data strobe buffering signal DQS_b2.

When the selection signal Sel_s is enabled to a high level, the selection circuit 234 may output the second data strobe buffering signal DQS_b2 among the first data strobe buffering signal DQS_b1 and the output signal from the second buffer 232, i.e., the second data strobe buffering signal DQS_b2.

The divider circuit 235 may divide the output signal from the selection circuit 234, i.e., the second data strobe buffering signal DQS_b2 to generate and output the divided signal QF and the divided bar signal QFB.

The first synchronizing circuit 236 may synchronize the divided signal QF and the divided bar signal QFB with the first data strobe buffering signal DQS_b1 to output the first and second data latch timing signals IDQS and IDQSB.

The second synchronizing circuit 236 may synchronize the first data latch timing signal IDQS with the first data strobe buffering signal DQS_b1 to output the third and fourth data latch timing signals QDQS and QDQSB.

Therefore, when the first and second fuse signals Fuse<0:1> have a high level and the set signal Set_s has a low level, the data latch timing signal generation circuit 230 may divide the output signal from the second buffer 232 into which the data strobe signal DQS and the reference voltage Vref may be inputted to generate the first to fourth data latch timing signals IDQS, IDQSB, QDQS and QDQSB.

When the first and second fuse signals Fuse<0:1> and the set signal Set_s have a high level, the control circuit 233 may disable the selection signal Sel_s and the enabling signal EN_s to a low level.

When the enabling signal EN_s is disabled to a low level, the second buffer 232 may be inactivated.

The first buffer 231 may buffer the data strobe signal DQS and the data strobe bar signal DQSB to generate and output the first data strobe buffering signal DQS_b1 and the first data strobe bar signal DQSB_b1.

When the selection signal Sel_s is disabled to a low level, the selection circuit 234 may output the first data strobe buffering signal DQS_b1 among the first data strobe buffering signal DQS_b1 and the output signal from the second buffer 232, i.e., the second data strobe buffering signal DQS_b2.

The divider circuit 235 may divide the output signal from the selection circuit 234, i.e., the first data strobe buffering signal DQS_b1 to generate and output the divided signal QF and the divided bar signal QFB.

The first synchronizing circuit 236 may synchronize the divided signal QF and the divided bar signal QFB with the first data strobe buffering signal DQS_b1 to output the first and second data latch timing signals IDQS and IDQSB.

The second synchronizing circuit 236 may synchronize the first data latch timing signal IDQS with the first data strobe buffering signal DQS_b1 to output the third and fourth data latch timing signals QDQS and QDQSB.

Therefore, when the first and second fuse signals Fuse<0:1> and the set signal Set_s have a high level, the data latch timing signal generation circuit 230 may divide the output signal from the first buffer 231 into which the data strobe signal DQS and the data strobe bar signal DQSB may be inputted to generate the first to fourth data latch timing signals IDQS, IDQSB, QDQS and QDQSB.

In an example of an embodiment, when the first fuse signal Fuse<0> among the first and second fuse signals Fuse<0:1> have a low level, the semiconductor device 200 may divide the output signal from the first buffer 231 configured to receive the data strobe signal DQS and the data strobe bar signal DQSB to generate the first to fourth data latch timing signals IDQS, IDQSB, QDQS and QDQSB. The semiconductor device 200 may latch the data DATA in response to the first to fourth data latch timing signals IDQS, IDQSB, QDQS and QDQSB to generate the internal data DATA_in<0:k>.

When the first fuse signal Fuse<0> has a high level and the second fuse signal Fuse<1> has a low level, the semiconductor device 200 may divide the output signal from the second buffer 232 configured to receive the data strobe signal DQS and the reference voltage Vref to generate the first to fourth data latch timing signals IDQS, IDQSB, QDQS and QDQSB regardless of the set signal Set_s.

When the first and second fuse signals Fuse<0:1> have a high level and the set signal Set_s has a low level, the semiconductor device 200 may divide the output signal from the second buffer 232 configured to receive the data strobe signal DQS and the reference voltage Vref to generate the first to fourth data latch timing signals IDQS, IDQSB, QDQS and QDQSB regardless of the set signal Set_s.

When the first and second fuse signals Fuse<0:1> have a high level and the set signal Set_s has a high level, the semiconductor device 200 may divide the output signal from the first buffer 231 configured to receive the data strobe signal DQS and the data strobe bar signal DQSB to generate the first to fourth data latch timing signals IDQS, IDQSB, QDQS and QDQSB regardless of the set signal Set_s.

In an example of an embodiment, the semiconductor device may select any one of the buffer into which the differential signals by the combination of the fuse signal and the set signal may be inputted as the input signals and the buffer configured to determine the level of the input signal based on the reference voltage. The semiconductor device may divide the output signal from the selected buffer to generate the data latch timing signals. The buffer having the differential signals as the input signals may be advantageous for a high frequency operation. The buffer configured to determine the level of the input signal based on the reference voltage may be advantageous for a low frequency operation. Thus, the semiconductor device of an example of an embodiment may be advantageous for the high frequency operation and the low frequency operation by the combination of the fuse signal and the set signal.

Hereinafter, operations of the semiconductor device 200 and the system may be illustrated below.

The levels of the first and second fuse signals Fuse<0:1> may be determined in accordance with the cuttings of the fuses. When the first fuse signal Fuse<0> among the first and second fuse signals Fuse<0:1> have a low level, the semiconductor device 200 may select the buffer having the differential signals as the input signals, for example, the first buffer 231. The semiconductor device 200 may generate the first to fourth data latch timing signals using the output signal from the selected buffer.

When the semiconductor device 200 is operated in a low operation mode, the fuse circuit 220 may output the first fuse signal Fuse<0> having the high level and the second fuse signal Fuse<1> having the low level.

When the first fuse signal Fuse<0> has a high level and the second fuse signal Fuse<1> has a low level, the semiconductor device 200 may select the second buffer 232 configured to buffer the input signal based on the voltage level of the reference voltage Vref. The semiconductor device 200 may generate the first to fourth data latch timing signals using the output signal from the selected buffer.

In order to operate the semiconductor device 200 in the high and low operation modes, the fuse circuit 220 may output the first fuse signal Fuse<0> having the high level and the second fuse signal Fuse<1> having the high level.

When the first and second fuse signals Fuse<0:1> may have a high level, the semiconductor device 200 may control the set circuit 210 by the command CMD and the address ADD inputted from the controller 100 to determine the level of the set signal Set_s.

When the first and second fuse signals Fuse<0:1> have a high level and the set signal Set_s has a low level, the semiconductor device 200 may select the second buffer 232. The semiconductor device 200 may generate the first to fourth data latch timing signals using the output signal from the selected second buffer 232.

When the first and second fuse signals Fuse<0:1> have a high level and the set signal Set_s has a high level, the semiconductor device 200 may select the first buffer 231. The semiconductor device 200 may generate the first to fourth data latch timing signals using the output signal from the selected first buffer 231.

According to an example of an embodiment, the semiconductor device 200 may select the buffer, which may be coincided with operational environments of the semiconductor device, among the buffers so that the semiconductor device may be properly operate with the operational environments. Further, when the operational environments of the semiconductor device 200 are acknowledged, the operation mode of the semiconductor device may be previously set using the fuse circuit. In contrast, when the operational environments of the semiconductor device 200 are not acknowledged, the operation mode of the semiconductor device may be set by changing the set signal using the controller.

In an example of an embodiment, the semiconductor device 200 may generate the data latch timing signals using the data strobe signal, the data strobe bar signal and the reference voltage. Alternatively, the semiconductor device 200 may be applicable for all of operations for selecting any one of a differential signal input buffer and a single ended input buffer and for performing a next operation.

The above described embodiments are intended to illustrate and not be limiting. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor device comprising:
   a set circuit configured to generate and output a set signal based on a command and an address;
   a fuse circuit configured to generate and output a fuse signal having a level determined in accordance with a cutting of a fuse;
   a data latch timing signal generation circuit configured to generate a plurality of data latch timing signals based on the set signal, the fuse signal, a data strobe signal and a data strobe bar signal, or based on the data strobe signal, the data strobe bar signal and a reference voltage; and
   a data sort circuit configured to latch and sort data based on the data latch timing signals to generate and output internal data.

2. The semiconductor device of claim 1, wherein the data latch timing signal generation circuit buffers the data strobe signal and the data strobe bar signal in accordance with the fuse signal and the set signal to generate a first data strobe buffering signal, and divides the first data strobe buffering signal to generate the data latch timing signals, or the data latch timing signal generation circuit buffers the data strobe signal based on a voltage level of the reference voltage in accordance with the fuse signal and the set signal to generate a second data strobe buffering signal, and divides the second data strobe buffering signal to generate the data latch timing signals.

3. The semiconductor device of claim 2, wherein the data latch timing signal generation circuit comprises:
   a first buffer configured to buffer the data strobe signal and the data strobe bar signal to generate the first data strobe buffering signal;
   a second buffer configured to buffer the data strobe signal based on the voltage level of the reference voltage to generate the second data strobe buffering signal;
   a control circuit configured to generate a selection signal based on the fuse signal and the set signal;
   a selection circuit configured to output any one of the first and second data strobe buffering signals based on the selection signal;
   a divider circuit configured to divide an output signal from the selection circuit to generate a divided signal; and
   a synchronizing circuit configured to synchronize the divided signal with the first data strobe buffering signal to generate the data latch timing signals.

4. The semiconductor device of claim 3, wherein the control circuit generates the selection signal based on the fuse signal regardless of the set signal, or based on the fuse signal and the set signal.

* * * * *